SPECTRUM LOCK-IN ARRANGEMENT WITH AUTOMATIC FREQUENCY CONTROL

Filed Aug. 11, 1948

INVENTOR.
EDUARD HERMAN HUGENHOLTZ
BY
AGENT.

Patented Dec. 8, 1953

2,662,180

UNITED STATES PATENT OFFICE 2,662,180

SPECTRUM LOCK-IN ARRANGEMENT WITH AUTOMATIC FREQUENCY CONTROL

Eduard Herman Hugenholtz, Eindhoven, Netherlands, assignor to Hartford National Bank and Trust Company, Hartford, Conn., as trustee Application August 11, 1948, Serial No. 43,594

Claims priority, application Netherlands September 23, 1947

7 Claims. (Cl. 250—36)

Figure 1:
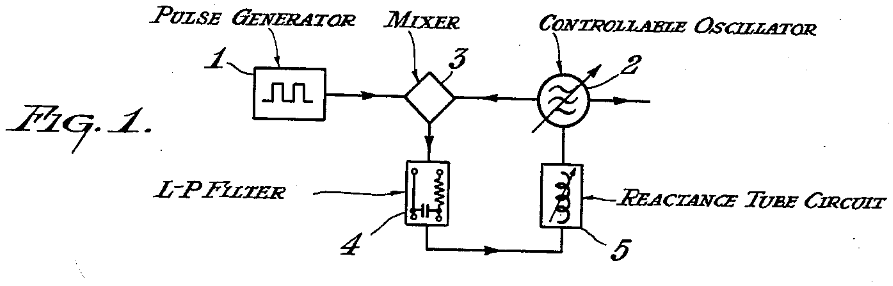

For producing an alternating voltage the frequency of which is variable in a stepwise manner within a given tuning range it is known to use an oscillator which essentially is continuously tunable, and the tuning members of which are locked at pre-determined tuning frequencies, for example by means of a click-knob mechanism.

Such an oscillator variable in a stepwise manner permits of rapidly adjusting with comparative accuracy a number of pre-determined tuning frequencies.

The invention has for its object to enable particularly high tuning accuracy of an oscillator tunable in a stepwise manner without concessions to the tuning speed.

According to the invention, for obtaining an alternating voltage the frequency of which is variable in steps of identical frequency spacing use is made of an oscillator which is preferably continuously tunable over the desired tuning range and of means for automatically correcting the oscillator frequency relatively to a control oscillation comprising a plurality of frequency components which are spaced at frequency spacings corresponding with the desired adjusting steps, the regulating voltage required for automatic frequency correction (AFC) being obtained by mixing of the oscillator voltage and the control oscillation and the maximum correcting range of the AFC means corresponding approximately with half the frequency spacing of successive components of the control spectrum.

In the copending U. S. application Serial No. 711,506, filed November 22, 1946, there is described more fully that the frequency of an oscillator coupled to a reactance valve is adapted to be stabilised at any component of the frequency spectrum of a pulse-like voltage by feeding, to the reactance valve, a control voltage obtained by mixing of the oscillator voltage and the pulse-like voltage.

The arrangement according to the present invention may be looked upon as obtained by suitable realisation and proportioning of the arrangements described in the said prior specification.

The control spectrum required with the present arrangement may be abstracted, if desired by the intermediary of frequency transposition, for example from a pulse or time base generator or else may be obtained by frequency modulation from a sinusoidal voltage.

The maintenance of a given frequency spacing (displacement distance) between the tuning range of the oscillator which is variable in a stepwise manner and a frequency band served by the control spectrum may be achieved by mixing the spectrum of difference frequencies obtained by mixing of the control spectrum and the oscillator voltage with an auxiliary voltage the frequency of which corresponds with the desired displacement distance, the voltage obtained by the latter mixing operation constituting the control voltage which is fed to the AFC means, preferably through a low pass filter.

In order that the invention may be more clearly understood and readily carried into effect, it will now be described more fully with reference to the accompanying drawing in which several embodiments of the arrangement according to the invention are shown.

Figure 1 shows an arrangement according to the invention in which the frequency variable in a stepwise manner is obtained from an oscillator which, tunable over the desired tuning range and the frequency of which is adapted to be synchronised with various frequency components of a control oscillation obtained from a pulse oscillator.

Figure 2:
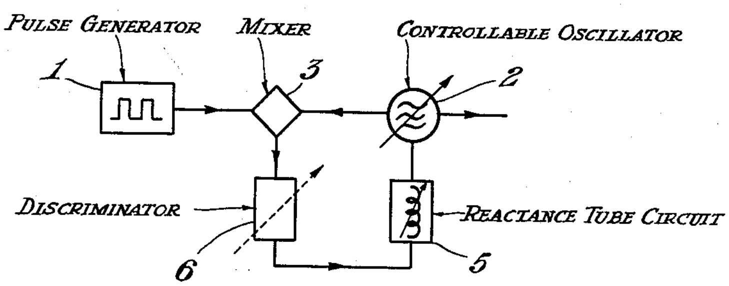
Figure 3:
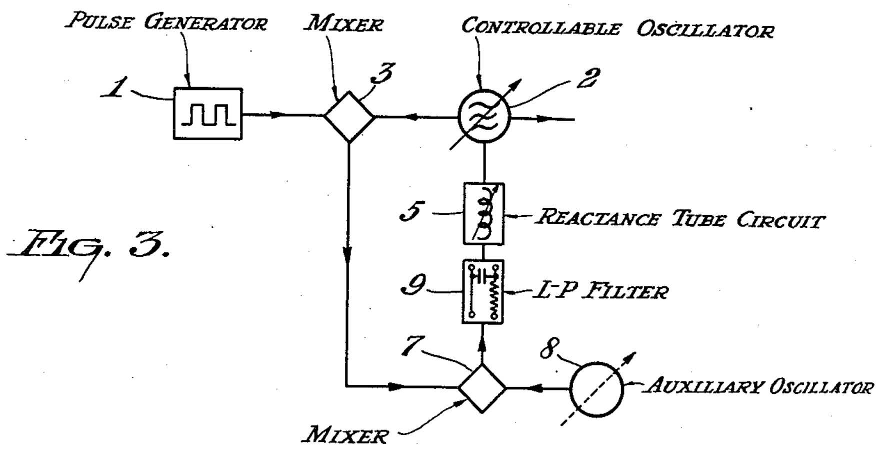

In the embodiment shown in Figure 2 the control spectrum and the tuning range of the oscillator are relatively displaced through a given frequency distance by the use of a tuned discriminator, and the circuit-arrangement shown in Figure 3 constitutes a variant in the arrangement shown in Figure 2, the displacement being brought about by means of an auxiliary oscillator.

In the figures corresponding elements are designated by like reference numerals.

The circuit arrangement shown in Fig. 1 comprises a generator 1 which supplies a pulse-like control oscillation, an oscillator 2 which is tunable over the desired tuning range and a mixing stage 3, for example a hexode-mixing tube, different control grids of which have supplied to them the signals to be mixed from the generator 1 and the oscillator 2. The output circuit of the mixing stage 3 includes a low pass filter 4 the cut-off frequency of which corresponds approximately with half the frequency spacing of successive components of the control spectrum of pulse generator 1. The output voltage of the filter 4 is supplied as an AFC-control voltage to a reactance tube or other regulating impedance 5 which acts upon the tuning frequency of the oscillator 2.

As described more fully in the above identified copending application the said circuit has the property of becoming automatically adjusted in such manner that the frequency of the sinusoidal alternating voltage abstracted from the oscillator 2 corresponds exactly with the frequency of one of the components of the control spectrum, the oscillator 2 at any tuning frequency always becoming adjusted, in view of the pass range of the low-pass filter 4, so that its stabilised frequency corresponds with that component of the spectrum of the pulse-like control oscillation which is nearest in frequency.

In the case of continuous variation of the tuning of the oscillator 2, for example by control of a tuning condenser included in the frequency-determining circuit of the oscillator 2 the frequency of the oscillator oscillations will vary discontinuously under the action of the various components of the control spectrum.

Starting with the condition in which the tuning frequency of the oscillator corresponds with that of a first spectrum component, the frequency of the alternating voltage abstracted from the oscillator 2 will initially remain unaltered in the case of continuous variation of the tuning frequency of the oscillator 2 due to the AFC control. If, however the control range of the AFC circuit (the so-called "holding range" that is to say the frequency range which is intermediate to different frequency-values and within which the oscillator once in synchronism continues to be synchronised with varying oscillator tuning to the control oscillation) is exceeded due to variation of the tuning frequency, stabilisation by the AFC circuit fails, with the result that the oscillator frequency tends to correspond with the frequency which is essentially given by the frequency-determining circuit of the oscillator 2 only. If however, the frequency difference between the tuning frequency of the oscillator 2 and the frequency of the next spectrum component is not excessive, that is to say falls within the so-called "catching range" (that is to say the range within which, at a given tuning of the oscillator, the frequency of the oscillation produced is automatically brought into synchronism with a control frequency differing therefrom) of the AFC circuit, the AFC circuit will now become operative to stabilise the oscillator frequency at the frequency of the said next spectrum component. This condition is maintained until, due to a further variation of the tuning frequency of the oscillator circuit the holding range of the AFC circuit is again exceeded, after which stabilisation at a further spectrum component may ensue provided that the latter is included in the catching range which then is valid for the AFC circuit. Thus, with continuous variation of the tuning frequency of the tank circuit of the oscillator 2, the frequency of the oscillations produced by this oscillator will vary discontinuously from one spectrum component to the other spectrum component and will in succession correspond with the frequencies of the successive components of the control oscillation spectrum. If the frequencies of the components of the control spectrum correspond with the desired tuning frequencies of the oscillator 2 the said desired frequencies will be obtained in succession in the case of continuous variation of the tuning of the oscillator 2.

When using the AFC control an amplifier valve connected as a reactance, the reactance circuit, being realised as usual, its control range measured in frequency spacings varies with the tuning frequency of the oscillator 2. This may result in that with continuous variation of the tuning frequency of the oscillator some spectrum components would be skipped as stabilising control oscillations due to an excessive holding range of the AFC circuit. This difficulty may be obviated in various ways, for example by the use of a coupling between the oscillator circuit and the reactance tube circuit, which varies with the tuning of the oscillator use of a suitable wattless feedback of the reactance tube varying with frequency, and so forth.

The practical utility of the invention may be illustrated best by a numerical example. Assuming the generator 1, which supplies the pulse-like control oscillation, to have a pulse repetition-frequency of $10^4$ cycles/sec., the use of the circuit shown in Fig. 1 permits of obtaining an oscillator which is adapted to be tuned between $10^4$ cycles/sec. and $2.10^6$ cycles/sec. in steps of $10^4$ cycles/sec. In this case care should be taken to see that the 200th harmonic of the pulse repetition-frequency still has a sufficient amplitude, for which purpose the pulse duration should be sufficiently low. In view of the large tuning range of the oscillator 2 this obviously involves partition of this range into several tuning ranges.

It will frequently be desirable that an oscillator should be available, the frequency of which is adapted to be controlled in comparatively small steps within a tuning range of, say, from 2 to 4 megacycles/sec.

The invention permits of realising this in various ways.

Thus, for example, a spectrum of 10 to 1000 kilocycles/sec. produce by a pulse generator having a fundamental frequency of 10 kilocycles/sec. may be transposed in frequency to the desired tuning range by means of an oscillation which is abstracted from a stable local oscillator and has a frequency of 3 megacycles/sec.

It is also possible to realise the AFC circuit so as constantly to maintain a frequency spacing of, for example, 2 megacycles/sec. between the stabilising spectrum component and the stabilised oscillator frequency by the use of the circuit arrangements shown in Figs. 2 and 3.

In contradistinction to the circuit arrangement shown in Fig. 1, that shown in Fig. 2 shows in the output circuit of the mixing stage 3 a discriminator 6 tuned to a frequency corresponding with the desired frequency spacing between the stabilising spectrum component and oscillator oscillation. Abstracted from the output circuit of this frequency discriminator 6 is a control voltage the polarity and value of which vary with the polarity and value of the frequency difference between the tuning frequency of the discriminator and the frequency of the oscillation fed thereto. This output voltage is utilised for controlling a reactance tube 5 which is coupled to the oscillator circuit and by which the oscillator frequency is trimmed so that a frequency difference, corresponding with the tuning frequency of the discriminator 6, is maintained between the said oscillator frequency and the stabilising spectrum component.

The use of a tuned frequency discriminator of standard type has the disadvantage that the stabilised oscillator frequency may differ slightly, for example by some few cycles/sec., from the desired oscillator frequency. Such divergences may be avoided entirely by the use of a so-called beat discriminator in the manner shown in Fig. 3.

Referring now to Fig. 3, the spectrum of difference frequencies obtained by mixing of the control spectrum and the oscillator voltage is mixed at a mixing stage 7 (the so-called beat discriminator) with an auxiliary voltage which is abstracted from an auxiliary oscillator 8 and the frequency of which corresponds with the said shift distance. The regulating voltage obtained as a result of the latter mixing controls, through a low pass filter 9 the cut-off frequency of which corresponds approximately with half the frequency spacing of successive spectrum components, a reactance tube 5 which is coupled to the frequency determining circuit of the oscillator 2 and by which the oscillator frequency is trimmed so as to correspond exactly with the sum of the frequencies of the stabilising spectrum component and the frequency of the auxiliary oscillator 8.

The circuit arrangements shown in Figs. 2 and 3 permit of the tuning frequency of the tuned discriminator 6 or the frequency of the oscillation abstracted from the auxiliary oscillator 8 being made variable and this permits of the spectrum of the tuning frequencies of the stabilised oscillator 2 being shifted a variable amount relatively to the control spectrum.

In contradistinction to that which is shown in the figures, the desired control spectrum may be obtained by causing an auxiliary oscillation the frequency of which corresponds with the desired frequency spacing between successive adjusting steps to frequency-modulate, a sinusoidal voltage the frequency of which is located for example centrally of the desired tuning range to be served in steps.

The circuit arrangement shown in Fig. 3, may be used in the case of so-called decadic composition of the frequencies to be produced by the oscillator 2. For this purpose, if for example the frequency of the oscillator 2 is tunable in steps of 100 kilocycles/sec. by the use of a pulse generator 1 having a fundamental frequency of 100 kilocycles/sec., the oscillator 8 serving for relative shifting of the frequency spectrum of the pulse generator 1 and the tuning range of the oscillator 2 should be replaced by an oscillator which itself is tunable in steps of for example 1 kilocycle/sec. or 10 kilocycle/sec., which in view thereof may be realised for example in accordance with the diagram of Fig. 1 with the use of a pulse generator which supplies the control spectrum and the fundamental frequency of which is 1 kilocycle/sec. or 10 kilocycles/sec.

If particularly rapid control of the oscillator 2, in the circuit-arrangements shown is desired it may be tunable by means of a click-knob mechanism. The accuracy requirements of the click-knob mechanism are very low since with an oscillator 2 regulable in steps of for example 100 kilocycles/sec. an AFC circuit the catching range of which is about 35 kilocycles/sec. can be used unobjectionably. The tuning thus obtained by means of the click-knob mechanism need only have an accuracy of about 35 kilocycles/sec., which with normal realisation of the oscillator circuit arrangement is readily achieved with the use of a click-knob mechanism of very great simplicity.

What I claim is:

1. Apparatus for producing an electrical wave whose frequency is variable in equi-spaced steps within a predetermined tuning range comprising a wave generator continuously variable in frequency within said predetermined range, a source producing a voltage constituted by a spectrum of equi-spaced oscillatory components whose spacing corresponds to the spacing of said steps, and an automatic-frequency-regulating system effecting a predetermined frequency relation between the operating frequency of said generator and a component in said spectrum and including a voltage-responsive frequency control device operatively coupled to said generator, a mixer coupled to said source and said generator to combine the component spectrum with said wave, means coupled to the output of said mixer to obtain a control voltage proportional to the deviation in the frequency relation between the operating frequency of said generator and said component from said predetermined relation, and means to apply said control voltage to said control device to maintain said predetermined relation, said system having a maximum regulating range corresponding approximately to half the frequency spacing of successive spectrum components.

2. An arrangement, as set forth in claim 1, wherein said source is constituted by a pulse generator.

3. An arrangement, as set forth in claim 1, wherein said source is constituted by an auxiliary oscillator producing an auxiliary oscillation whose frequency corresponds with the desired frequency spacing between successive steps in said range, and a sinusoidal oscillator whose frequency is located within said range, and means to modulate said sinusoidal oscillation with said oscillator to produce the desired component spectrum.

4. Apparatus for producing an electrical wave whose frequency is variable in equi-spaced steps within a predetermined tuning range comprising a wave generator continuously variable in frequency within said range, a source producing a voltage constituted by a spectrum of equi-spaced oscillatory components whose spacing corresponds to the spacing between said steps, and an automatic-frequency-regulating system effecting synchronism between the operating frequency of said generator and the most proximate component in said spectrum, said system including a voltage-responsive frequency control device operatively coupled to said generator, a mixer coupled to said generator and said source to combine the wave and said component spectrum, a low-pass filter coupled to the output of said mixer and having a band-pass corresponding approximately to half the frequency spacing of successive spectrum components to derive from said mixer a control voltage proportional to the frequency difference between the wave of said generator and the most proximate component of said spectrum, and means to apply said control voltage to said control device to effect the desired synchronism.

5. Apparatus for producing an electrical wave whose frequency is variable in equi-spaced steps within the predetermined tuning range comprising a wave generator continuously variable in frequency within a predetermined range, a source producing a voltage constituted by a spectrum of equi-spaced oscillatory components, the spacing between said components corresponding to the spacing between said steps, and an automatic-frequency-regulating system to maintain a predetermined frequency displacement between the operating frequency of said generator and the most proximate component in said spectrum, said system including a voltage-responsive frequency control device operatively coupled to said generator, a mixer coupled to said source and said generator to combine said component spectrum and said wave, a frequency discriminator coupled to the output of said mixer and tuned to a frequency corresponding to said predetermined frequency displacement to produce a control voltage proportional to the departure from said displacement, and means to apply said control voltage to said control device to maintain the said predetermined displacement.

6. Apparatus for producing an electrical wave whose frequency is variable in equi-spaced steps within a predetermined tuning range comprising a wave generator continuously variable in frequency within said range, a source producing a voltage constituted by a spectrum of equi-spaced oscillatory components whose spacing corresponds to the spacing between said steps, and an automatic-frequency-regulating system effecting a predetermined frequency displacement between the operating frequency of said generator and the most proximate component in said spectrum, said system including a voltage-responsive frequency control device operatively coupled to said generator, a mixer coupled to said generator and said source to combine the voltage of said source and said wave, an auxiliary oscillator tuned to a frequency corresponding to said predetermined frequency displacement, a beat-frequency discriminator coupled to the output of said mixer and said auxiliary oscillator, a low-pass filter having a band-pass corresponding to approximately one half the frequency spacing between the components in said spectrum to produce a control voltage proportional to the deviation in the frequency displacement between said component and said wave from said predetermined frequency displacement, and means to apply said control voltage to said control device to maintain the desired frequency displacement.

7. Apparatus, as set forth in claim 6, wherein such auxiliary oscillator is tunable to vary said predetermined displacement.

EDUARD HERMAN HUGENHOLTZ.

References Cited in the file of this patent

UNITED STATES PATENTS

| Number | Name | Date |
|---|---|---|
| 2,206,695 | Guanella | July 2, 1940 |
| 2,398,694 | Case | Apr. 16, 1946 |
| 2,406,125 | Ziegler et al. | Aug. 20, 1946 |
| 2,460,112 | Wright et al. | Jan. 25, 1949 |
| 2,476,840 | Colander | July 19, 1949 |